United States Patent
Chern et al.

(10) Patent No.: US 8,661,389 B2
(45) Date of Patent: Feb. 25, 2014

(54) SYSTEMS AND METHODS OF DESIGNING INTEGRATED CIRCUITS

(75) Inventors: Chan-Hong Chern, Palo Alto, CA (US); Fu-Lung Hsueh, Cranbury, NJ (US); Li-Chun Tien, Tainan (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 106 days.

(21) Appl. No.: 13/084,748

(22) Filed: Apr. 12, 2011

(65) Prior Publication Data

US 2012/0266126 A1    Oct. 18, 2012

(51) Int. Cl.
*G06F 17/50*    (2006.01)
(52) U.S. Cl.
USPC ............... 716/118; 716/110; 716/119
(58) Field of Classification Search
USPC ........................................ 716/118
See application file for complete search history.

(56) References Cited

U.S. PATENT DOCUMENTS

| 7,290,234 B2 * | 10/2007 | Shibayama ............ 716/119 |
| 2005/0280031 A1 * | 12/2005 | Yano ............ 257/202 |
| 2010/0281446 A1 * | 11/2010 | Hou et al. ............ 716/6 |

* cited by examiner

*Primary Examiner* — Vuthe Siek
*Assistant Examiner* — Eric Lee
(74) *Attorney, Agent, or Firm* — Lowe Hauptman & Ham, LLP

(57) ABSTRACT

A method of designing an integrated circuit includes providing a cell library including a first and second cell structures. The cell structures each include a dummy gate electrode disposed on a boundary. An edge gate electrode is disposed adjacent to the dummy gate electrode. An oxide definition (OD) region has an edge disposed between the edge gate electrode and the dummy gate electrode. The method includes determining if the cell structures are to be abutted with each other. If so, the method includes abutting the cell structures. If not so, the method includes increasing areas of portions of the OD regions between the edge gate electrodes and the dummy gate electrodes.

21 Claims, 15 Drawing Sheets

US 8,661,389 B2

SYSTEMS AND METHODS OF DESIGNING INTEGRATED CIRCUITS

TECHNICAL FIELD

The present disclosure relates generally to the field of semiconductor devices, and more particularly, to systems and methods of designing integrated circuits.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1:
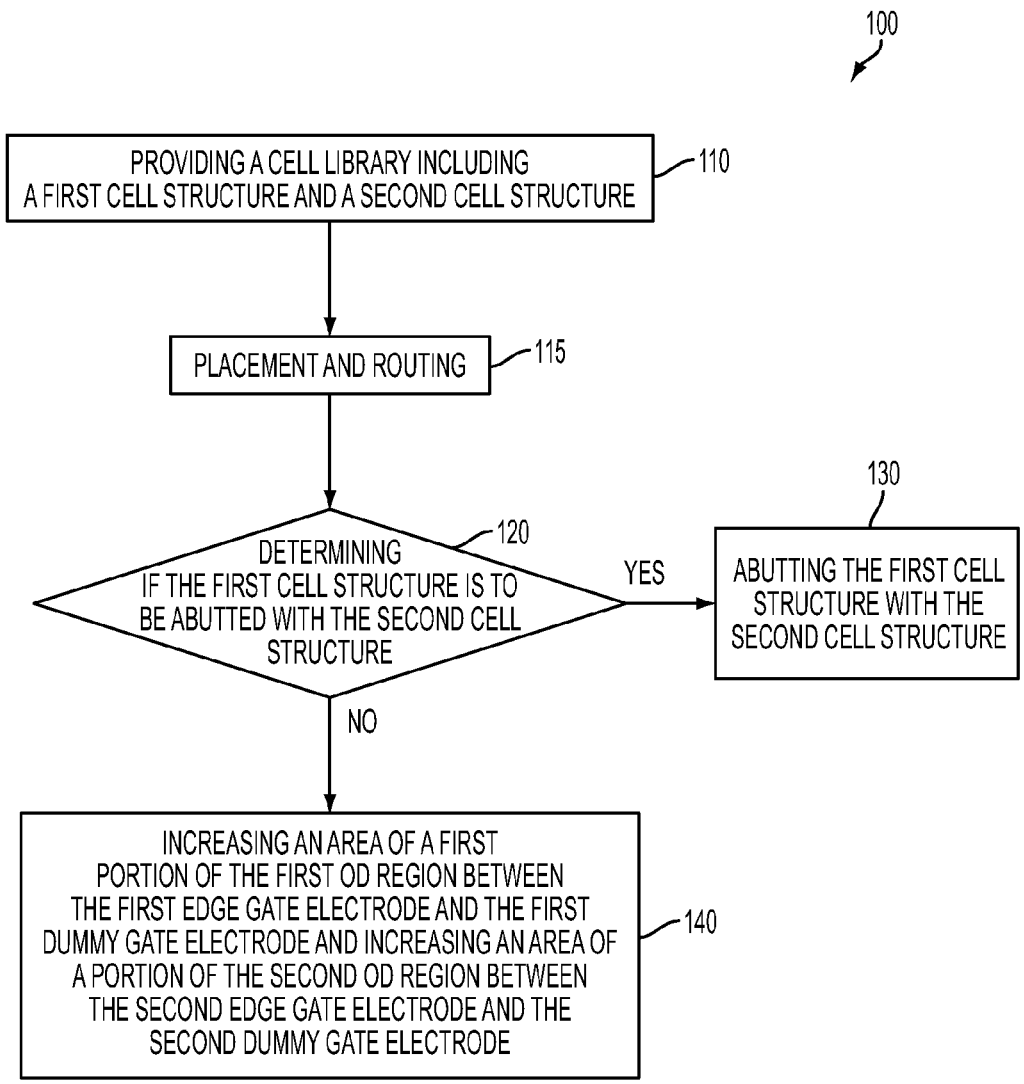
FIG. 1 is a flowchart of a first exemplary method of designing an integrated circuit.

For integrated circuits, edge transistors usually have source/drain (S/D) regions that are located on verges of oxide definition (OD) regions and shallow trench isolation (STI) features. That is, the S/D regions of the edge transistors have OD regions that are smaller than those of non-edge transistors. The small OD regions of the edge transistors may result in contact resistance variations of the integrated circuits. The contact resistance variations become even worse if stress-engineering epitaxial structures are formed in the small OD regions.

It is understood that the following descriptions provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one feature's relationship to another feature. The spatially relative terms are intended to cover different orientations of the device including the features.

FIG. 1 is a flowchart of an exemplary method of designing an integrated circuit. It is understood that FIG. 1 has been simplified for a better understanding of the concepts of the present disclosure. Accordingly, it should be noted that additional steps may be provided before, during, and after the method of FIG. 1, and that some other steps may only be briefly described herein.

Referring to FIG. 1, a method 100 of designing an integrated circuit includes providing a cell library including a first cell structure and a second cell structure (block 110). The first cell structure can include a first dummy gate electrode disposed on a first boundary of the first cell structure. The first cell structure can include a first edge gate electrode disposed adjacent to the first dummy gate electrode. The first cell structure can include a first oxide definition (OD) region having a first edge disposed between the first dummy gate electrode and the first edge gate electrode. The second cell structure can include a second dummy gate electrode disposed on a second boundary of the second cell structure. The second cell structure can include a second edge gate electrode disposed adjacent to the second dummy gate electrode. The second cell structure can include a second OD region having a second edge disposed between the second dummy gate electrode and the second edge gate electrode. The method 100 includes placing and routing the cell structures to form an integrated circuit (block 115). The method 100 includes determining if the first cell structure is to be abutted with the second cell structure (block 120). If the first cell structure is to be abutted with the second cell structure, the method 100 includes abutting the first cell structure with the second cell structure (block 130). If the first cell structure is not to be abutted with the second cell structure, the method 100 includes increasing an area of a first portion of the first OD region between the first dummy gate electrode and the first edge gate electrode and increasing an area of a portion of the second OD region between the second dummy gate electrode and the second edge gate electrode (block 140).

Figure 2A:
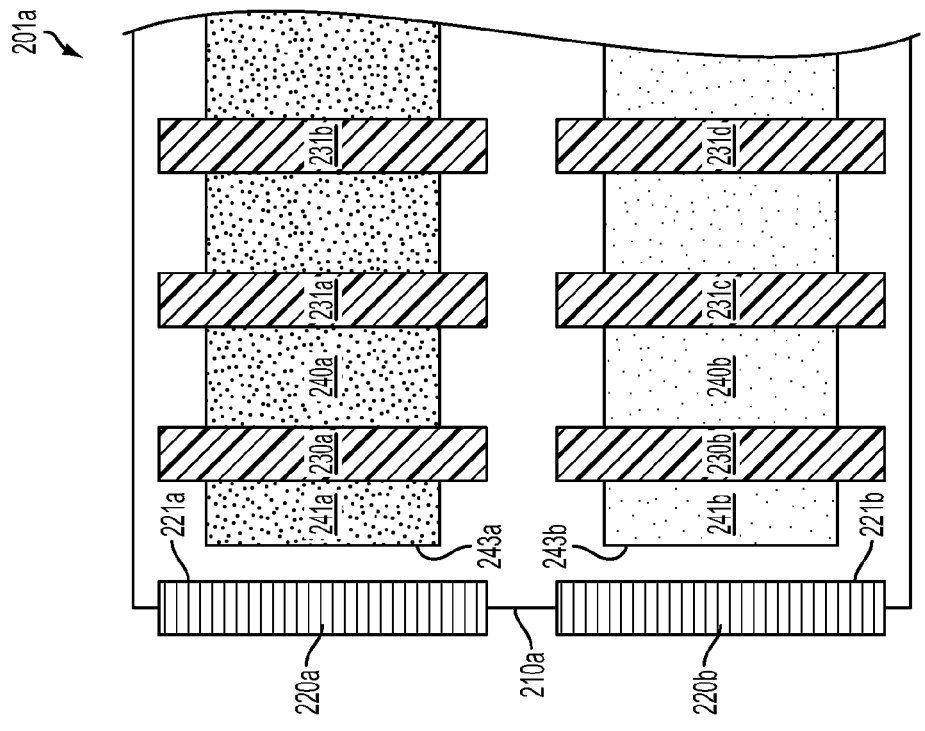
FIG. 2A is a schematic drawing illustrating exemplary layout layers of exemplary cell structures of a cell library.
Figure 2A:
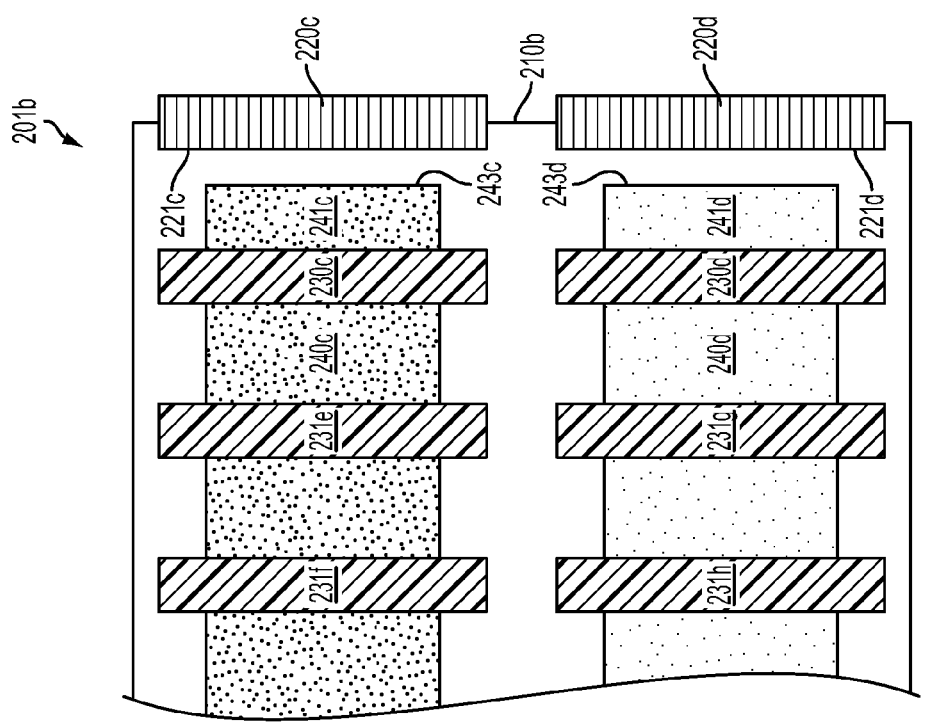

For example, a cell library can include cell structures 201a and 201b as shown in FIG. 2A. It is noted that the exemplary drawing shown in FIG. 2A merely depicts overlaps of a diffusion layer and a gate electrode layer. In some embodiments, the cell structures 201a and 201b can include more layers, e.g., a contact layer, via layers, metallic layers, one or more other layout layers, and/or any combinations thereof. Furthermore, the heights of the gate electrodes and diffusion layers do not mean to be necessarily equal between cell structures 201a and 201b. In FIG. 2A, the cell structures 201a and 201b can each include respective dummy gate electrodes 220a-220d disposed on boundaries 210a and 210b. The cell structures 201a and 201b can each include respective edge gate electrodes 230a-230d disposed adjacent to the dummy gate electrodes 220a-220d, respectively.

In some embodiments, the cell structures 201a and 201b can each include respective oxide definition (OD) regions 240a-240d. The OD regions 240a-240d can be spaced from each other by an isolation structure (not labeled). The isolation structure can include a shallow trench isolation (STI) structure and/or a local oxidation of silicon (LOCOS) structure. The OD regions 240a-240d can have edges 243a-243d, respectively. The edges 243a-243d can each be disposed between the respective dummy gate electrodes 220a-220d and edge gate electrodes 230a-230d. In some embodiments, the cell structures 201a and 201b can include gate electrodes 231a-231d and 231e-231h, respectively. The gate electrodes 231a-231h can be referred to as non-edge gate electrodes. In other embodiments, the OD regions 240a-240d can include OD portions 241a-241d, respectively, each of which can extend between the respective edge gate electrodes 230a-230d and dummy gate electrodes 220a-220d.

In some embodiments, the OD regions 240a and 240c can be provided for forming at least one P-type transistor and the OD regions 240b and 240d can be provided for forming at least one N-type transistor. In some embodiments, the integrated circuit that is to be designed can include a digital circuit, an analog circuit, a mixed-signal circuit, a static random access memory (SRAM) circuit, an embedded SRAM circuit, dynamic random access memory (DRAM) circuit, an embedded DRAM circuit, a non-volatile memory circuit, e.g., FLASH, EPROM, $E^2$PROME, a field-programmable gate array circuit, and/or any combinations thereof. In other embodiments, the at least one P-type transistor using the OD regions 240a and 240c and the at least one N-type transistor using the OD regions 240b and 240d can be deployed in an inverter, a logic gate circuit, an amplifier, a charge pump circuit, or any circuit that has a CMOS device.

Figure 2B:
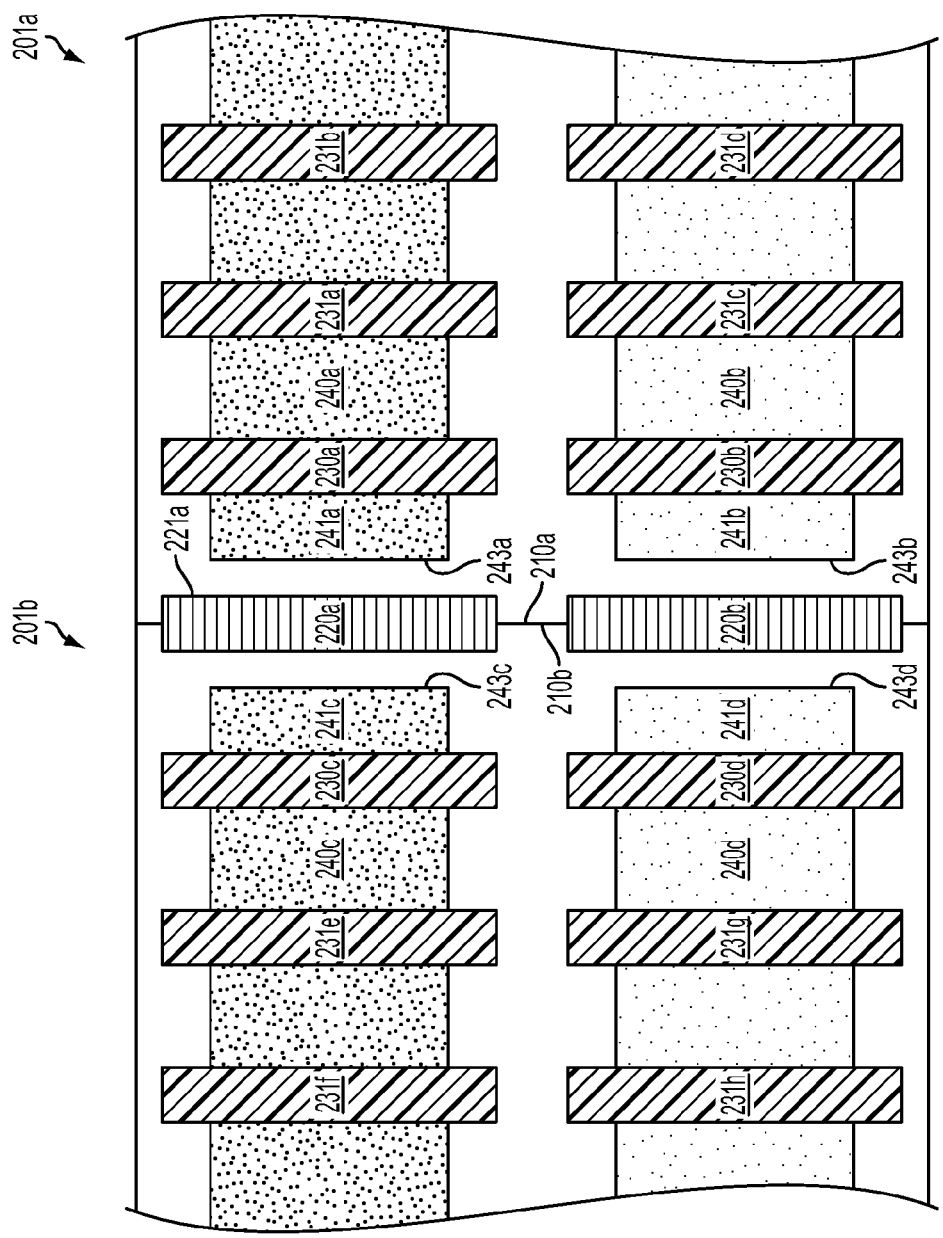
FIG. 2B is a schematic drawing illustrating exemplary layout layers of an integrated circuit including abutted cell structures.

Referring again to FIG. 1, after placing and routing the cell structures 201a and 201b (block 115), the block 120 determines if the cell structures 201a and 201b are to be abutted to each other. If the cell structures 201a and 201b are to be abutted to each other, the method 100 includes abutting the cell structures 201a and 201b (block 130). The abutted cell structures 201a and 201b are shown in FIG. 2B. In FIG. 2B, the boundaries 210a and 210b of the cell structures 201a and 201b, respectively, can be abutted to each other. The dummy gate electrodes 220a and 220b can be shared by the cell structures 201a and 201b.

Referring again to FIG. 1, if the cell structures 201a and 201b are not to be abutted to each other, the method 100 includes increasing an area of a first portion of the first OD region between the first edge gate electrode and the first dummy gate electrode (block 140). For example, the area of the OD portion 241a (shown in FIG. 2A) can be increased so as to be the same size area as the area of the OD portion 245a (shown in FIG. 2C). In other embodiments, the areas of the OD portions 241b-241d (shown in FIG. 2A) can be increased so as to be the same size area as the areas of the OD portion 245b-245d, respectively (shown in FIG. 2C). The OD portions 245a-245d can provide desired electrical contacts with contact plugs (not shown) that are formed on the OD portions 245a-245d.

Figure 2C:
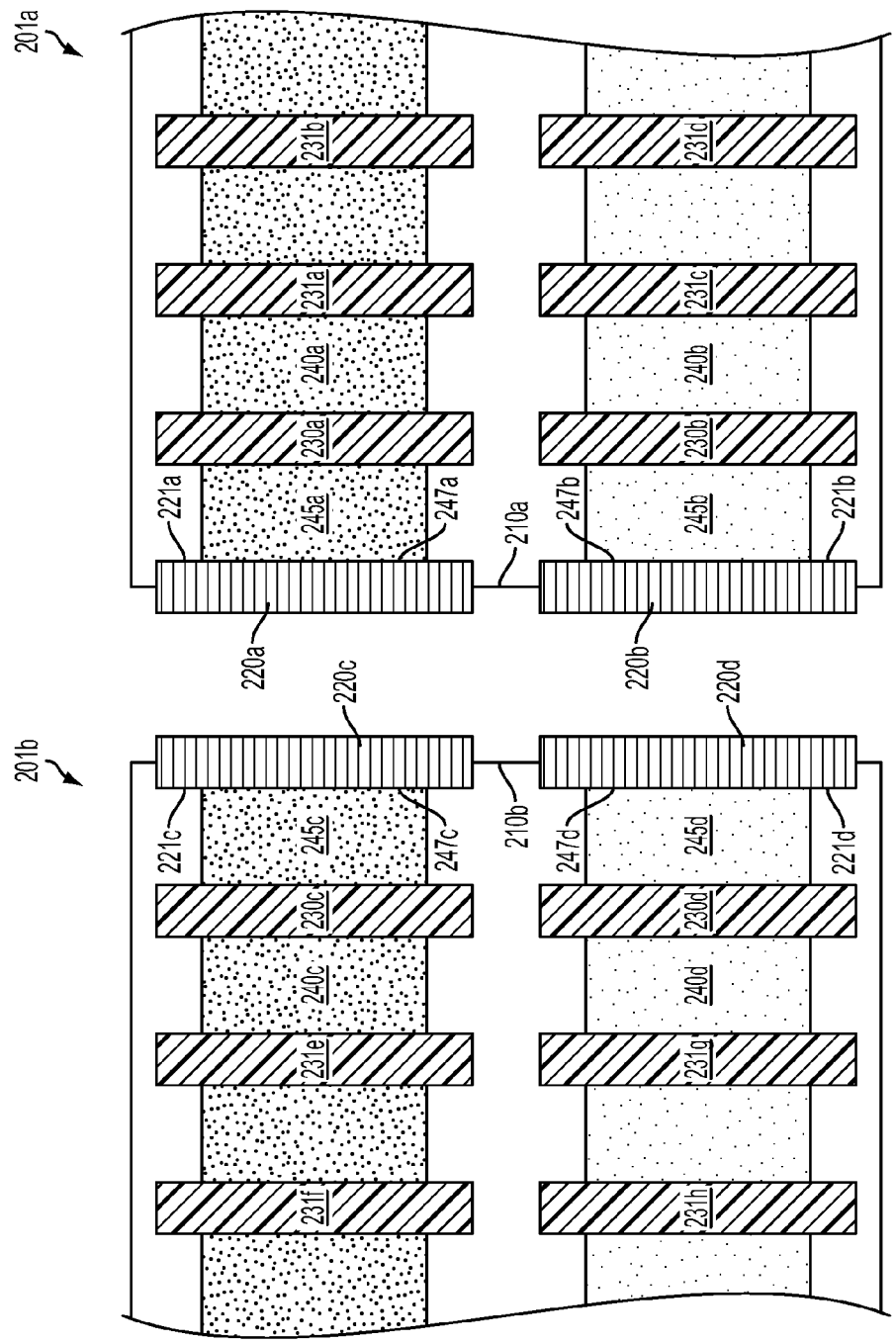
FIGS. 2C-2E are schematic drawings illustrating exemplary layout layers of an integrated circuit including non-abutted cell structures with extended OD portions.

In some embodiments, the areas of the OD portions 241a-241d can be increased by extending edges 243a-243d of the OD portions 241a-241d, respectively (shown in FIG. 2A), such that the edges 247a-247d of the OD portions 245a-245d can be substantially aligned with edges 221a-221d of the dummy gate electrodes 220a-220d, respectively, as shown in FIG. 2C. In other embodiments, increasing the areas of the OD portions 241a-241d can be achieved by filling OD portions within gaps between the OD portions 241a-241d and the dummy gate electrodes 220a-220d, respectively.

Figure 2D:
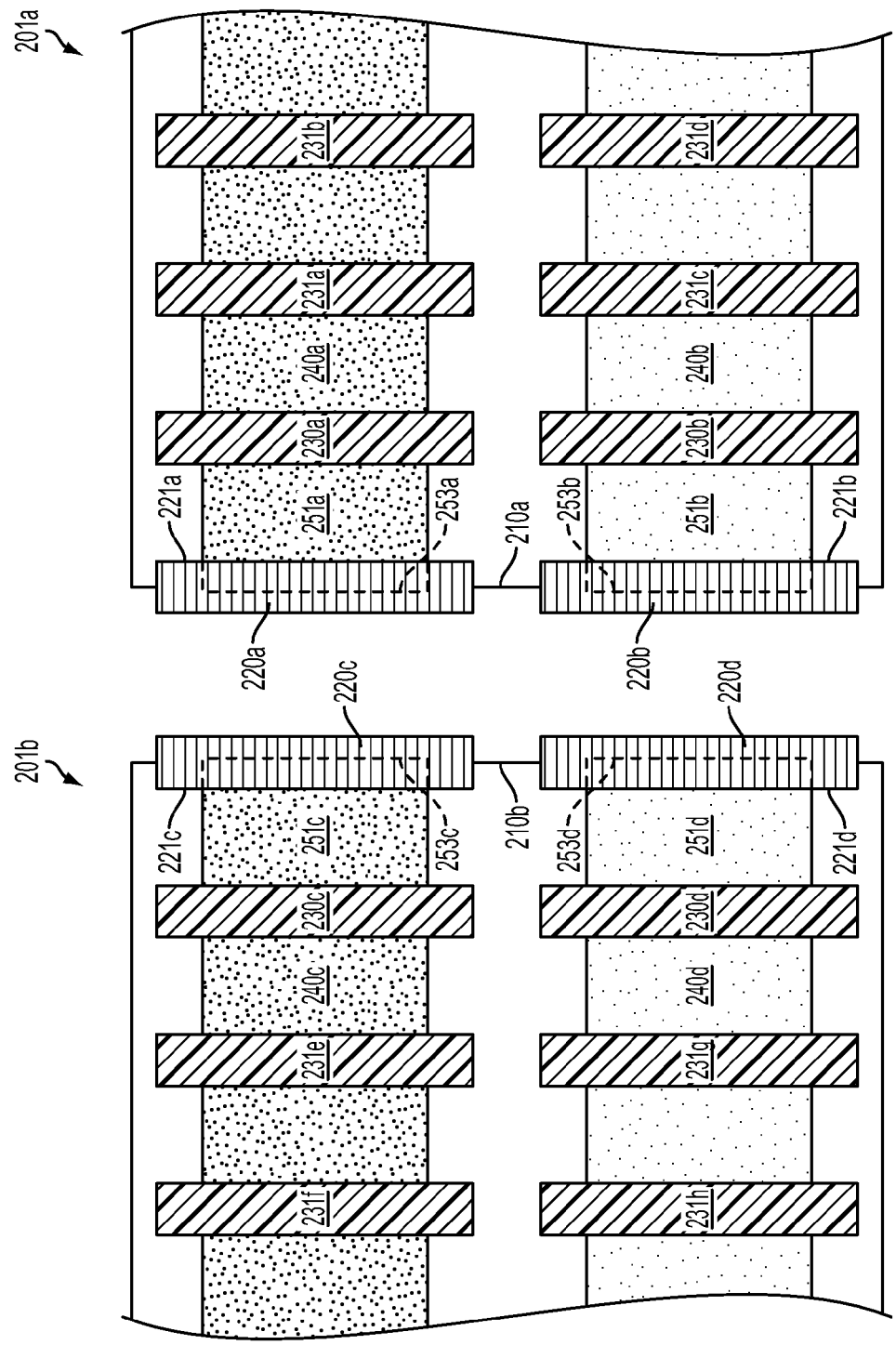

In other embodiments, the areas of the OD portions 241a-241d (shown in FIG. 2A) can be increased so as to be the same size area as the areas of the OD portions 251a-251d (shown in FIG. 2D). For example, the areas of the OD portions 241a-241d can be increased by extending edges 243a-243d of the OD portions 241a-241d, respectively (shown in FIG. 2A), such that the OD portions 251a-251d overlap with the dummy gate electrodes 220a-220d, respectively, as shown in FIG. 2D. Edges 253a-253d of the OD portions 251a-251d can be extended to and under the dummy gate electrodes 220a-220d, respectively.

Figure 2E:
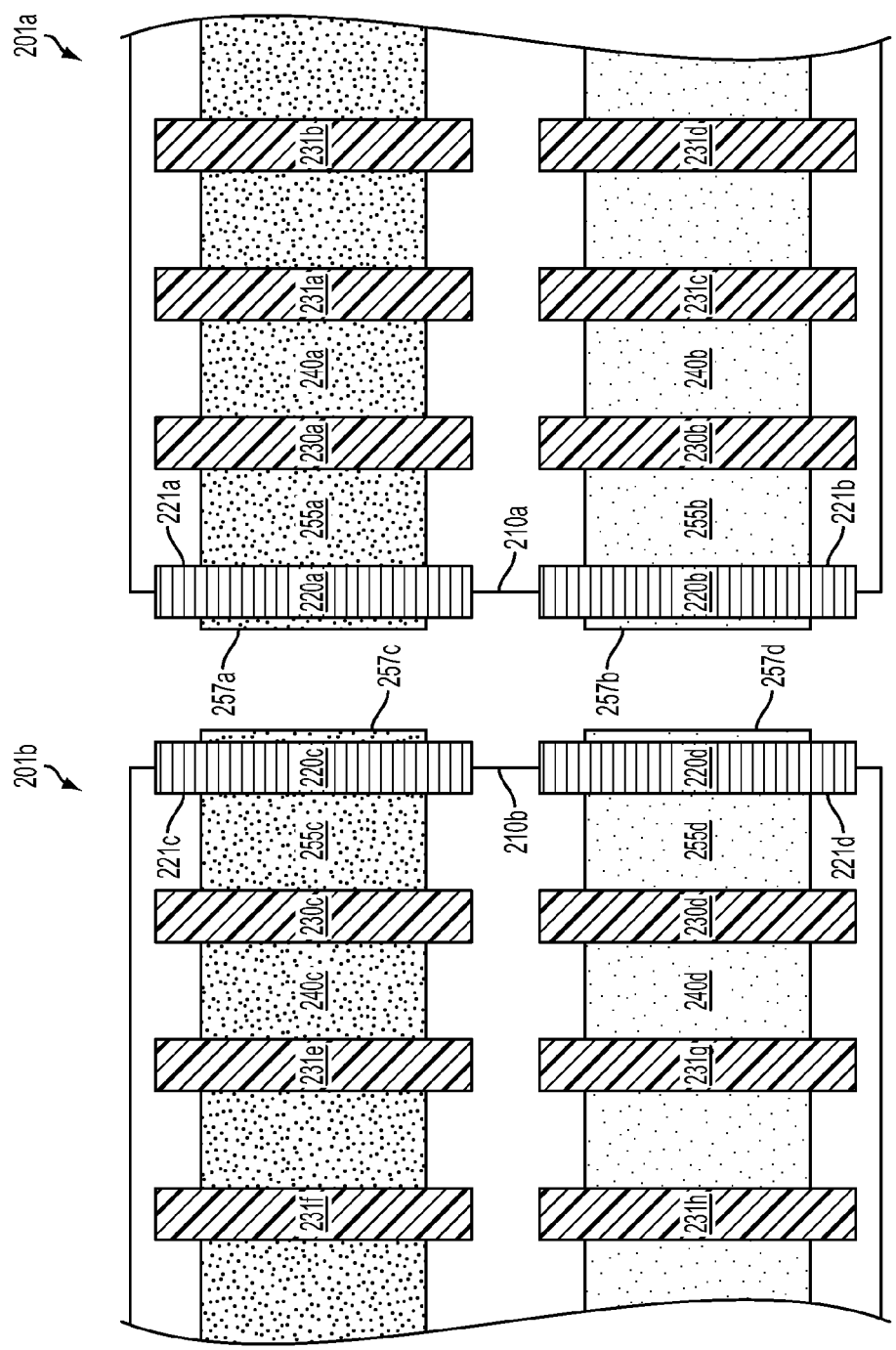

In still other embodiments, the areas of the OD portions 241a-241d (shown in FIG. 2A) can be increased so as to be the same size areas as the areas of the OD portions 255a-255d (shown in FIG. 2E). For example, the areas of the OD portions 241a-241d can be increased by extending edges 243a-243d of the OD portions 241a-241d, respectively (shown in FIG. 2A), such that the OD portions 255a-255d extend cross the dummy gate electrodes 220a-220d, respectively, as shown in FIG. 2E. Edges 257a-257d of the OD portions 255a-255d can be extended cross the dummy gate electrodes 220a-220d, respectively. In some embodiments, the OD portion 255a is spaced from the OD portion 255c by a predetermined distance, such that an STI or a LOCOS can be successfully formed and the OD portion 255a is substantially electrically isolated from the OD portion 255c during an electrical operation.

In some embodiments, the abutted cell structures and/or non-abutted cell structures described above in conjunction with FIGS. 2A-2E can be saved as a layout database. The layout database can be converted to a graphic data system (GDS) file for making masks for semiconductor manufacturing.

As described above in conjunction with FIGS. 2C-2E, the OD portions of the edge transistors are increased. The increased OD portions allow contact plugs to be formed on the OD portions rather than on verges of OD regions. Thus, STI features can be substantially reduced and contact resistance variations resulting from the small OD regions can be substantially eliminated.

Figure 3A:
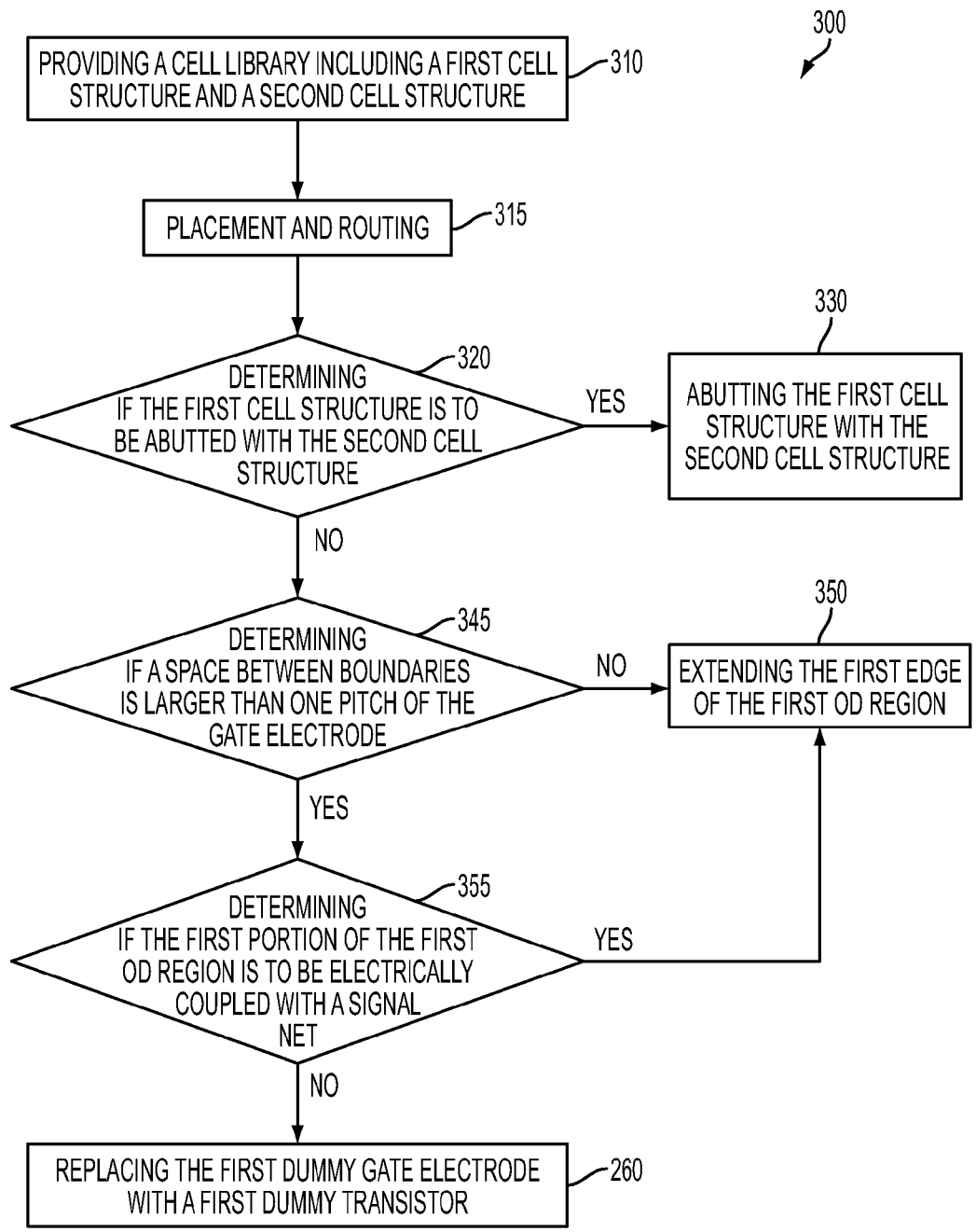
FIG. 3A is a flowchart of a second exemplary method of designing an integrated circuit.

FIG. 3 is a flowchart of another exemplary method of designing an integrated circuit. Items of FIG. 3A that are the same or similar items in FIG. 1 are indicated by the same reference numerals, increased by 200. It is understood that FIG. 3A has been simplified for a better understanding of the concepts of the present disclosure. Accordingly, it should be noted that additional steps may be provided before, during, and after the method of FIG. 3A, and that some other steps may only be briefly described herein.

Referring to FIG. 3, a method 300 of designing an integrated circuit can include providing a cell library including a first cell structure and a second cell structure (block 310). The method 300 can include placing and routing the cell structures to form an integrated circuit (block 315). The method 300 can include determining if the first cell structure is to be abutted with the second cell structure (block 320). If the first cell structure is to be abutted with the second cell structure, the method 300 includes abutting the first cell structure with the second cell structure (block 330).

Figure 3B:
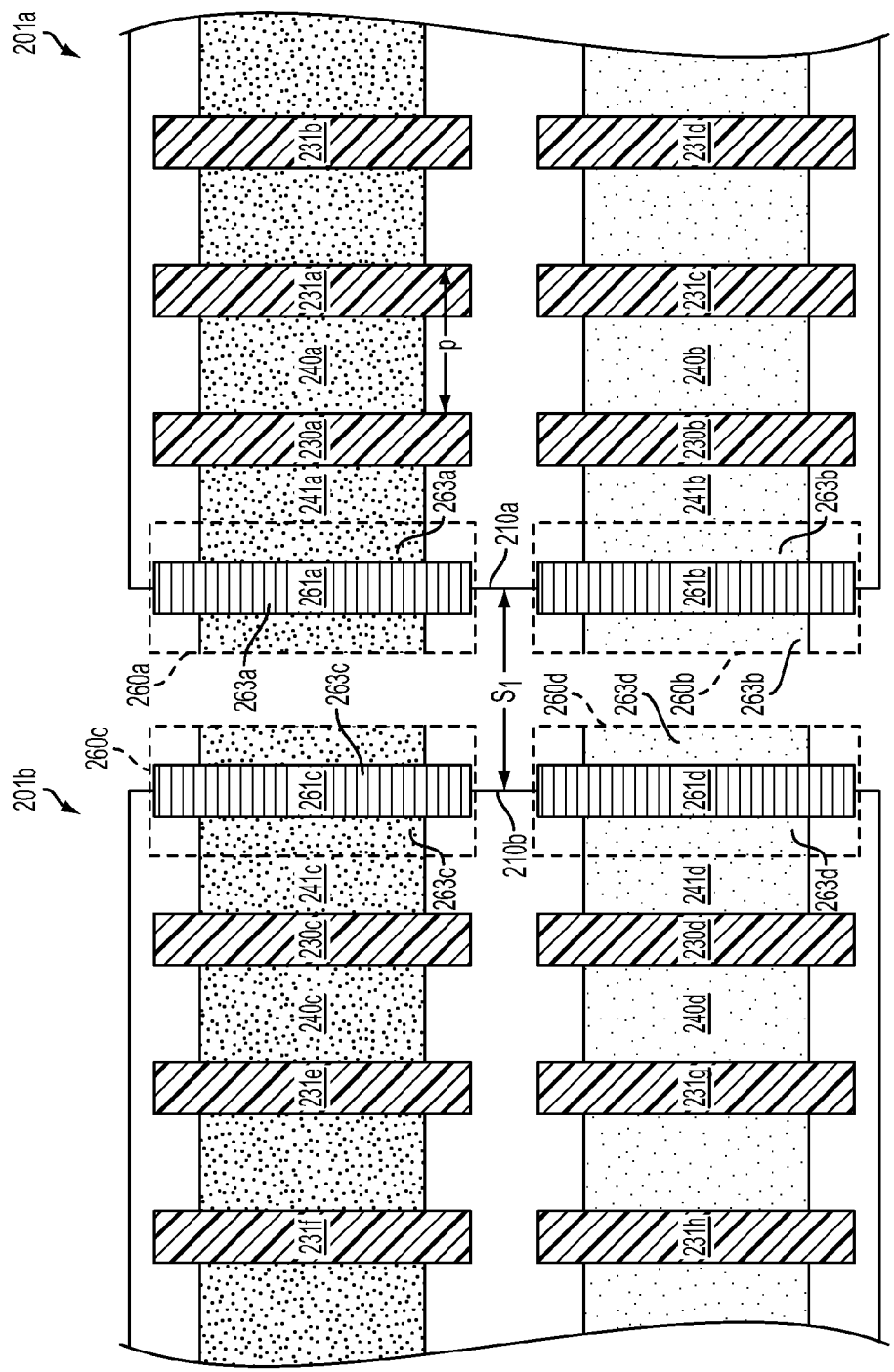
FIG. 3B is a schematic drawing illustrating exemplary layout layers of an integrated circuit including non-abutted cell structures with a spacer larger than a gate electrode pitch.

In some embodiments, if the first cell structure is not to be abutted with the second cell structure, the method 300 includes determining if a space between boundaries is larger than a pitch of the gate electrode (block 345). For example, a space $S_1$ is between the boundaries 210a and 210b as shown in FIG. 3B. A pitch P is a distance from an edge of the gate electrode 231a to an edge of the edge gate electrode 230a as shown in FIG. 3B. If the space $S_1$ is not larger than the pitch P, the method 300 includes extending the edges of the OD portions 241a-241d (shown in FIG. 2A) so as to achieve the OD portions 245a-245d, 251a-251d or 255a-255d as described above in conjunction with FIGS. 2C-2E, respectively.

In some embodiments, if the space $S_1$ is larger than the pitch P, the method 300 includes determining if the first portion of the first OD region is to be electrically coupled with a signal net (block 355). The signal net means that the node is not electrically coupled to a power voltage, e.g., $V_{CC}/V_{DD}$, or ground voltage, e.g., $V_{SS}$. For example, if the OD portions 241a-241d (shown in FIG. 3B) are to be electrically coupled with signal nets, the method 300 includes extending the edges of the OD portions 241a-241d (shown in FIG. 2A) so as to achieve the OD portions 245a-245d, 251a-251d or 255a-255d as described above in conjunction with FIGS. 2C-2E, respectively.

In some embodiments, if the OD portions 241a-241d (shown in FIG. 3B) are not to be electrically coupled with signal nets, the method 300 includes replacing the first dummy gate electrode with a first dummy transistor (block 360). For example, dummy transistors 260a-260d can replace the dummy gate electrodes 220a-220d, respectively, as shown in FIG. 3B. The dummy transistors 260a-260b include dummy gate electrodes 261a-261d and OD portions 263a-263d, respectively. By replacing the dummy gate electrodes 220a-220d with the dummy transistors 260a-260d, the OD portions 263a-263d can abut and/or overlap with the OD portions 241a-241d, respectively. Though replacing the dummy gate electrodes 220a-220b with the dummy transistors 260a-260c, the method 300 is not limited thereto. In some embodiments, the method 300 can include extending or filling the OD portions as described above in conjunction with FIGS. 2C-2E.

Figure 4A:
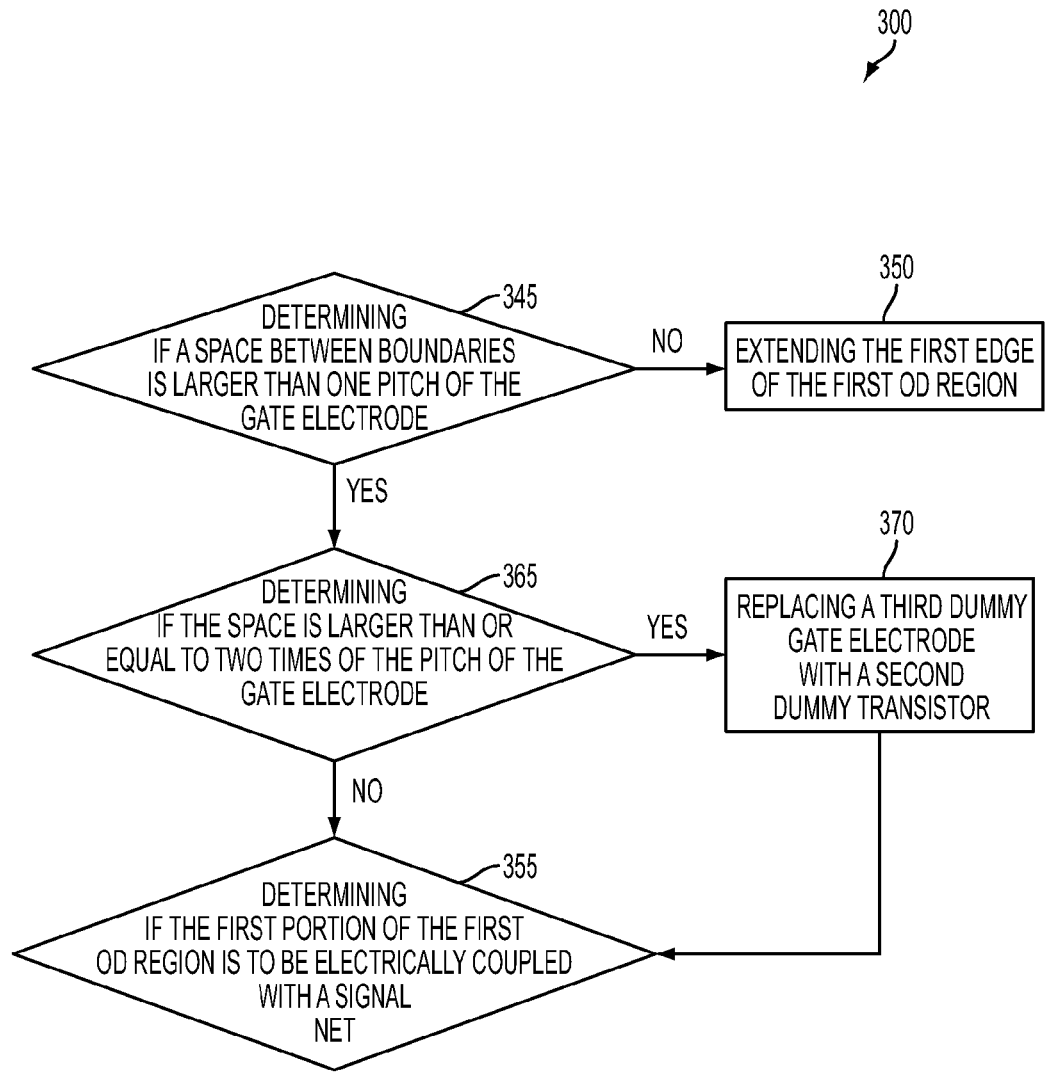
FIG. 4A is a flowchart illustrating optional steps of designing an integrated circuit.
Figure 4B:
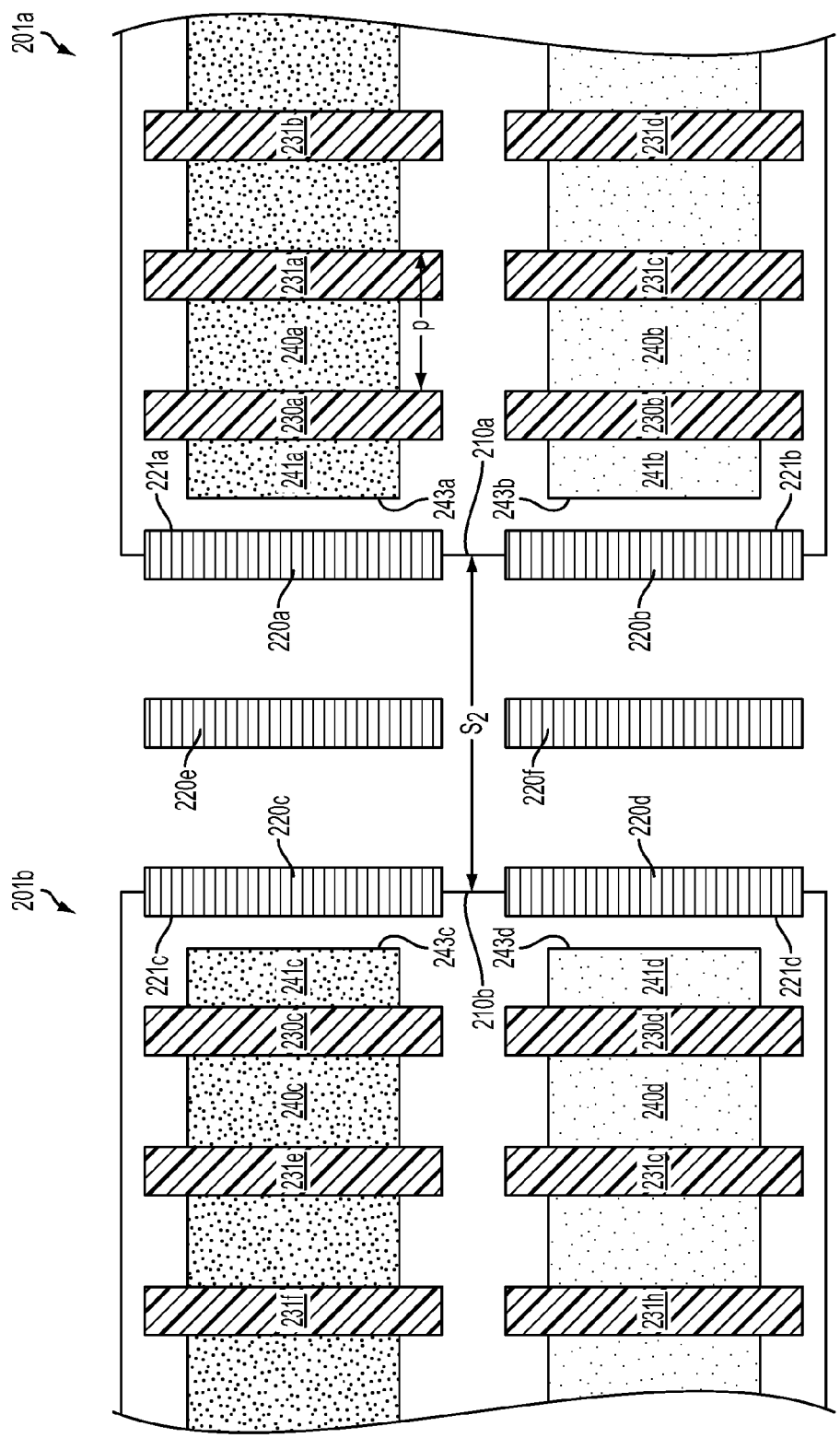
FIG. 4B and 4C are schematic drawings illustrating example layout layers of integrated circuits in accordance with some embodiments.

In some embodiments, after the block 345 the method 300 can optionally include determining the space is larger than or equal to two times of the pitch (block 365) as shown in FIG. 4A. For example, after the placement and routing, dummy gate electrodes 220e and 220f can be disposed between the cell structures 201a and 201b as shown in FIG. 4B. A space $S_2$ is a distance between the boundaries 210a and 210b.

Figure 4C:
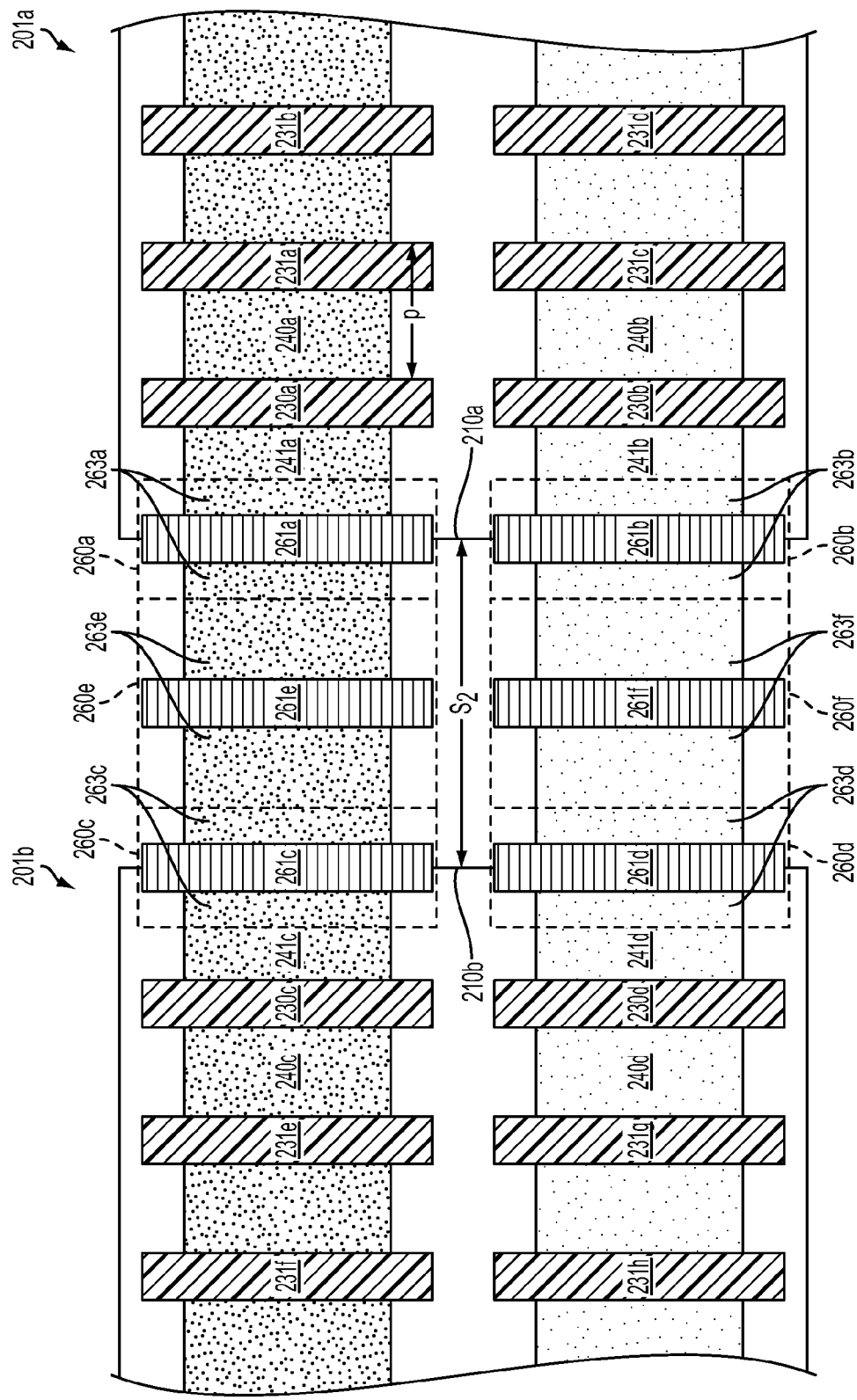

In some embodiments, if the space $S_2$ is not larger than or equal to two times of the pitch P, the method 300 goes to block 355. In other embodiments, if the space $S_2$ is larger than or equal to two times of the pitch P, the method 300 can optionally include replacing the dummy gate electrodes 220e and 220f with dummy transistors 260e and 260f, respectively, as shown in FIG. 4C. The dummy transistors 260e and 260f include dummy gate electrodes 261e and 261f and OD portions 263e and 263f, respectively. By replacing the dummy gate electrodes 220e and 220f with the dummy transistors 260e and 260f, the OD portions 263e and 263f can abut and/or overlap with the OD portions 263a, 263c and 263b, 263d, respectively.

It is noted that the flowchart shown in FIG. 4A is merely exemplary. In some embodiments, the stop of the block 365 can be performed after the block 355. In other embodiments, the replacement of the dummy gate electrodes 220a-220f with the dummy transistors 260a-260f can be performed by the same process.

Figure 5:
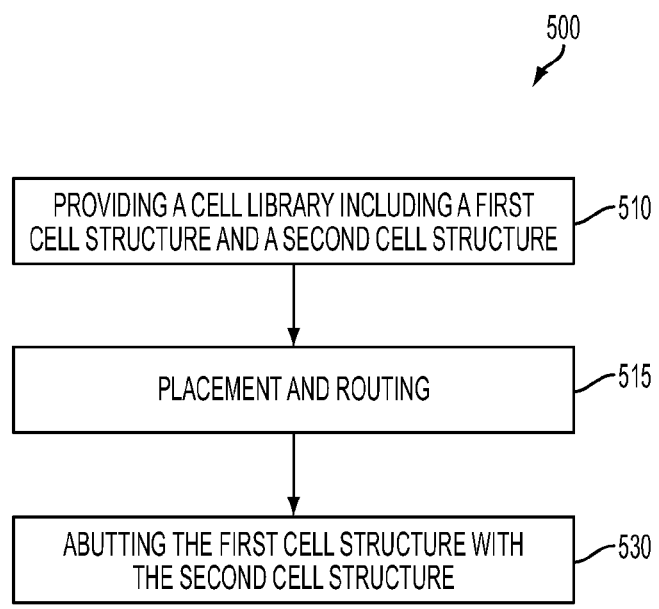
FIG. 5 is a flowchart of a third exemplary method of designing an integrated circuit.

FIG. 5 is a flowchart of another exemplary method of designing an integrated circuit. It is understood that FIG. 5 has been simplified for a better understanding of the concepts of the present disclosure. Accordingly, it should be noted that additional steps may be provided before, during, and after the method of FIG. 5, and that some other steps may only be briefly described herein.

Referring to FIG. 5, a method 500 of designing an integrated circuit includes providing a cell library including a first cell structure and a second cell structure (block 510). The first cell structure can include a first dummy gate electrode spaced from a first boundary of the first cell structure, a first edge gate electrode disposed adjacent to the first dummy gate electrode, and a first oxide definition (OD) region having a first portion continuously extending between the first edge gate electrode and the first dummy gate electrode. The second cell structure can include a second dummy gate electrode spaced from a second boundary of the second cell structure, a second edge gate electrode disposed adjacent to the second dummy gate electrode, and a second oxide definition (OD) region having a second portion continuously extending between the second edge gate electrode and the second dummy gate electrode. Furthermore, the heights of the gate electrodes and diffusion layers do not mean to be necessarily equal between cell structures. The method 500 includes placing and routing the cell structures to form an integrated circuit (block 515). The method 500 includes abutting the first cell structure with the second cell structure (block 530).

Figure 6A:
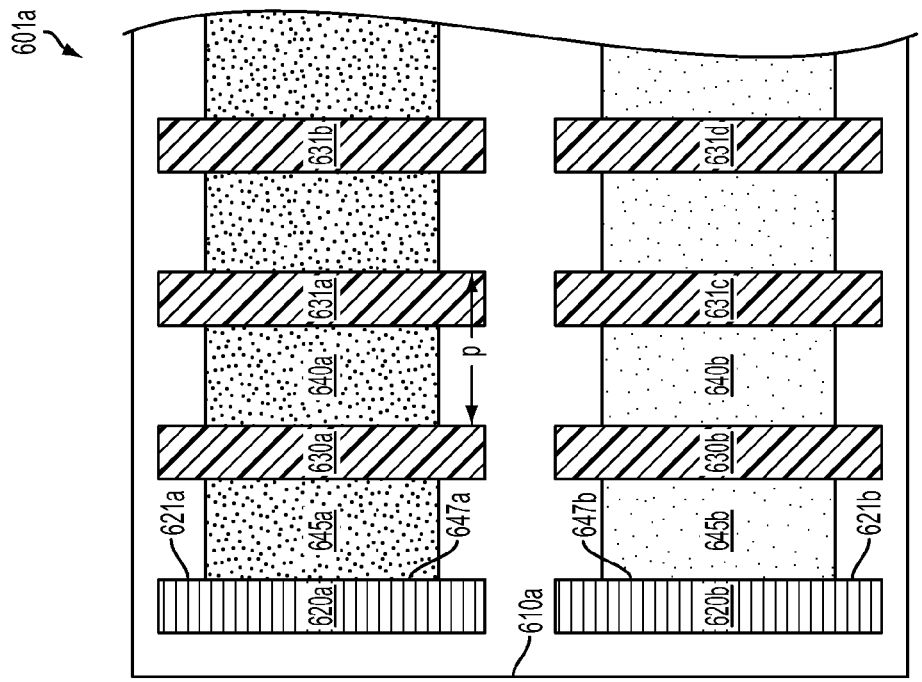
FIG. 6A is a schematic drawing illustrating exemplary layout layers of exemplary cell structures of a cell library.
Figure 6A:
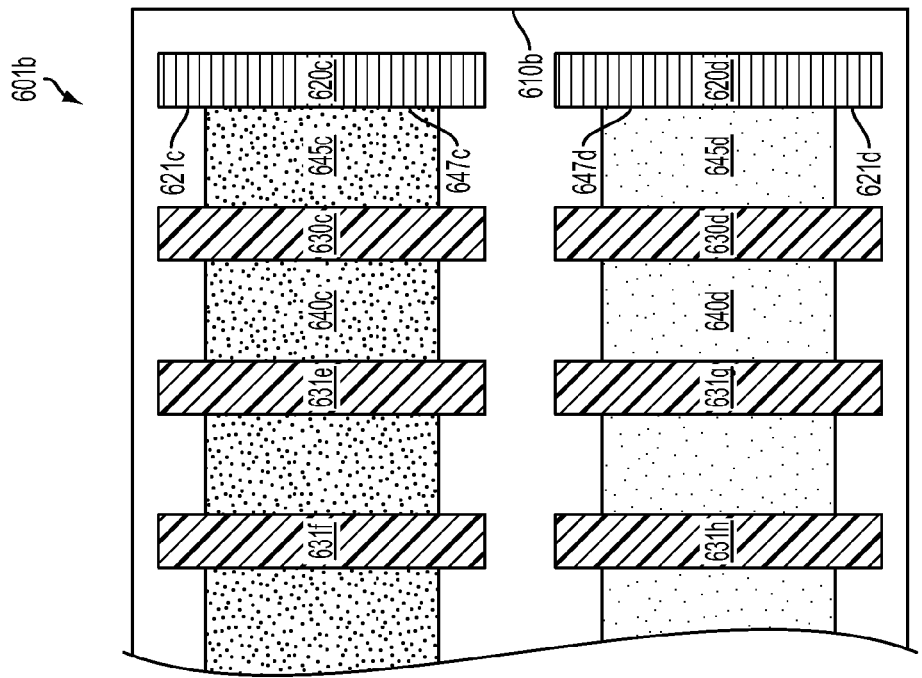

For example, a cell library can include cell structures 601a and 601b as shown in FIG. 6A. It is noted that the exemplary drawing shown in FIG. 6A merely depicts overlaps of a diffusion layer and a gate electrode layer. Items of FIG. 6A that are the same or similar items in FIG. 2C are indicated by the same reference numerals, increased by 400. In FIG. 6A, the cell structures 601a and 601b can include respective dummy gate electrodes 620a-620d disposed within boundaries 610a and 610b. The cell structures 601a and 601b can include respective edge gate electrodes 630a-630d disposed adjacent to the dummy gate electrodes 620a-620d, respectively. The cell structures 601a and 601b can include respective oxide definition (OD) regions 640a-640d. The OD regions 640a-640d can have OD portions 645a-645d that continuously extend between the respective edge gate electrodes 630a-630d and dummy gate electrodes 620a-620d. The OD portions 645a-645d can have edges 647a-647d, respectively. The edges 647*a*-647*d* can each be substantially aligned with edges 621*a*-621*d* of the dummy gate electrodes 620*a*-620*d*, respectively.

Figure 6B:
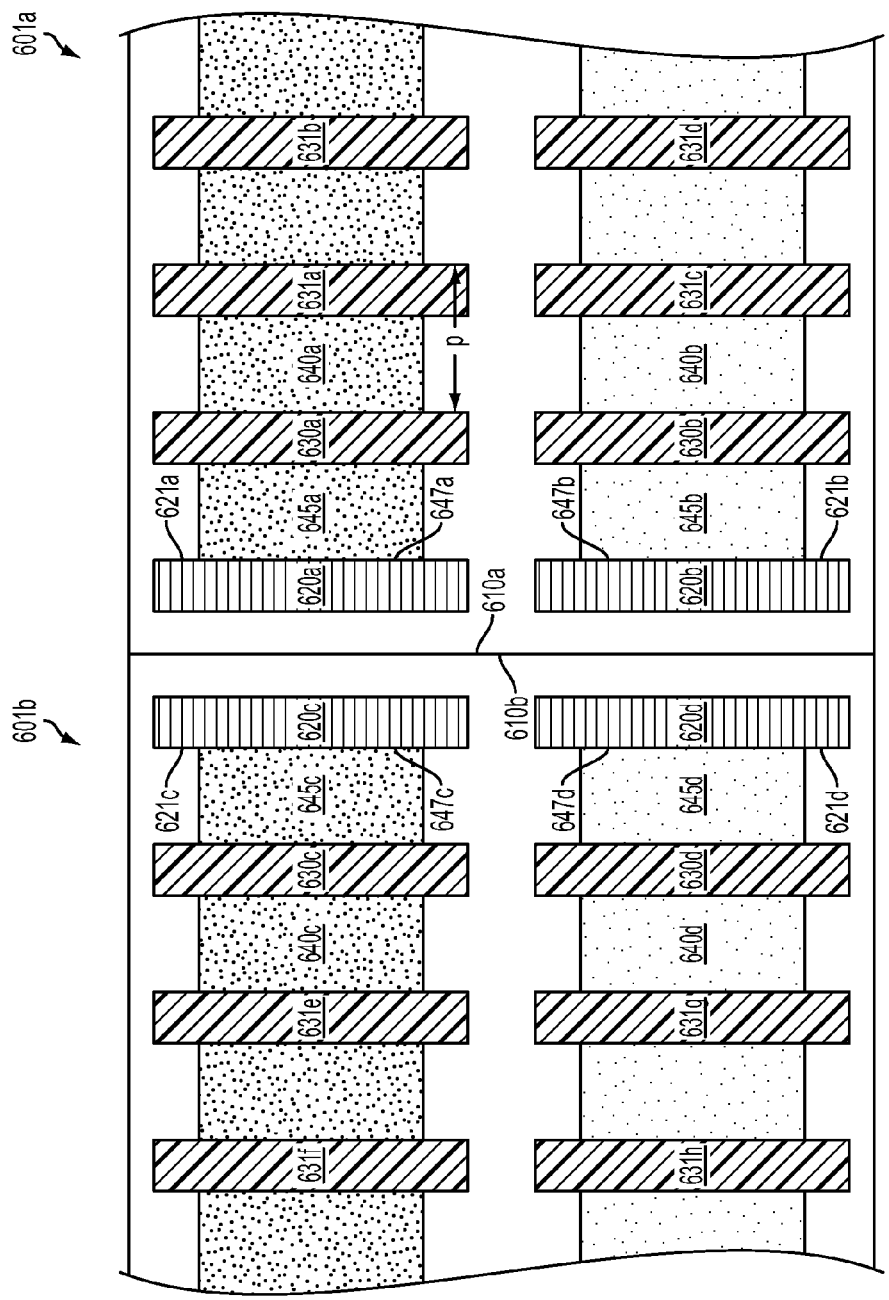
FIG. 6B is a schematic drawing illustrating exemplary layout layers of an integrated circuit including abutted cell structures.

Referring again to FIG. 5, after placing and routing the cell structures 601*a* and 601*b* (block 515), the method 500 includes abutting the cell structures 601*a* and 601*b* (block 530). The abutted cell structures 601*a* and 601*b* can be shown in FIG. 6B. In FIG. 6B, the boundaries 610*a* and 610*b* of the cell structures 601*a* and 601*b*, respectively, can be abutted to each other.

Referring again to FIG. 6B, the dummy gate electrodes 620*a*, 620*b* and 620*c*, 620*d* can be spaced from the boundaries 610*a* and 610*b*, respectively, by a predetermined distance. After abutting the cell structures 601*a* and 601*b*, the space between the dummy gate electrodes 620*a* and 620*c* can substantially electrically isolate the OD portions 645*a* and 645*c* during an electrical operation. It is noted that the OD portions 645*a*-645*d* continuously extend between the edge gate electrodes 630*a*-630*d* and the dummy gate electrodes 620*a*-620*d*, respectively. Contact plugs (not shown) for electrical connections land on the OD portions 645*a*-645*d*.

It is noted that the cell structures 601*a* and 601*b* shown in FIGS. 6A and 6B are merely exemplary. In some embodiments, the method 500 can abut cell structures having OD portions that are the same as or similar to the OD portions 251*a*-251*d* and 255*a*-225*d* described above in conjunction with FIGS. 2D and 2E.

Figure 7:
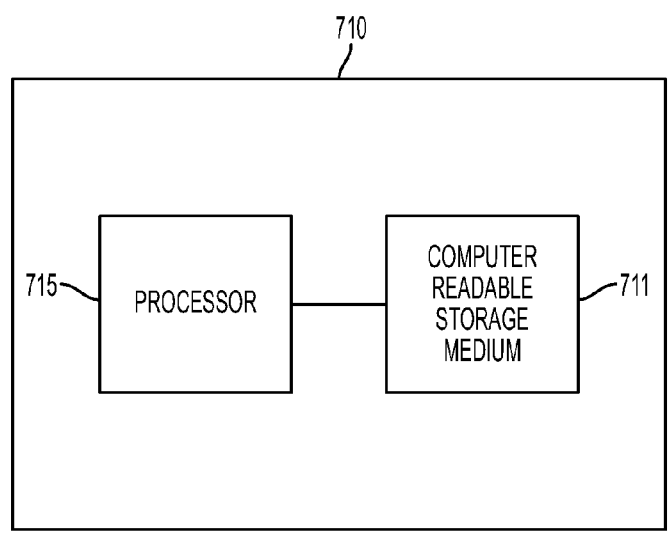
FIG. 7 is a schematic drawing illustrating an exemplary computer system for circuit designs.

FIG. 7 is a schematic drawing illustrating an exemplary computer system for circuit designs. In FIG. 7, a computer system 710 can include a computer readable storage medium 711 that is electrically coupled with a processor 715.

In some embodiments, the computer readable storage medium 711 can be configured to store a cell library including a first cell structure and a second cell structure. The first cell structure includes a first dummy gate electrode disposed on a first boundary of the first cell structure, a first edge gate electrode disposed adjacent to the first dummy gate electrode, and a first oxide definition (OD) region having a first edge disposed between the first edge gate electrode and the first dummy gate electrode. The second cell structure includes a second dummy gate electrode disposed on a second boundary of the second cell structure, a second edge gate electrode disposed adjacent to the second dummy gate electrode, and a second OD region having a second edge disposed between the second edge gate electrode and the second dummy gate electrode. For example, the computer readable storage medium 711 can be configured to store the cell structures 201*a* and 201*b* described above in conjunction with FIG. 2A. In other embodiments, the computer readable storage medium 711 can be configured to store the cell structures 601*a* and 601*b* described above in conjunction with FIG. 6A.

In some embodiments, the computer readable storage medium 711 can be an electronic, magnetic, optical, electromagnetic, infrared, a semiconductor system (or apparatus or device). For example, the computer readable storage medium 711 can include a semiconductor or solid-state memory, a magnetic tape, a removable computer diskette, a read-only memory (ROM), a rigid magnetic disk, and/or an optical disk. In some embodiments using optical disks, the computer readable storage medium 711 can include a compact disk-read only memory (CD-ROM), a compact disk-read/write (CD-R/W), and/or a digital video disc (DVD).

In some embodiments, the processor 715 can be configured to determine if the first cell structure is to be abutted with the second cell structure (block 120) as described above in conjunction with FIG. 1. If the first cell structure is to be abutted with the second cell structure, the processor 715 can be configured to abut the first cell structure with the second cell structure (block 130) as described above in conjunction with FIGS. 1 and 2B. In other embodiments, the processor 715 can be configured to abut the cell structures 601*a* and 601*b* (block 530) as described above in conjunction with FIG. 5.

In some embodiments, if the first cell structure is not to be abutted with the second cell structure, the processor 715 can be configured to increase an area of a first portion of the first OD region between the first edge gate electrode and the first dummy gate electrode (block 140) as described above in conjunction with FIGS. 1 and 2C-2E. In some embodiments, the processor 715 can be encoded with a computer program code. The processor 715 can be configured to execute the computer program code for designing integrated circuits. The processor 715 can be a central processing unit (CPU), a multi-processor, a distributed processing system, and/or any suitable processing unit.

In some embodiments, if the first cell structure is not to be abutted with the second cell structure, the processor 715 can be further configured to determine if a space between the first and second boundaries is larger than a pitch of the first gate electrode (block 345) as described above in conjunction with FIG. 3A. If the space is not larger than the pitch of the first gate electrode, the processor 715 can be configured to increase the area of the first portion by extending the first edge of the first OD region (block 350) as described in conjunction with FIG. 3A.

In some embodiments, if the space is larger than the pitch of the first gate electrode, the processor 715 can be further configured to determine if the first portion of the first OD region is to be electrically coupled with a signal net (block 355) as described above in conjunction with FIG. 3A. If the first portion of the first OD region is to be electrically coupled with a signal net, the processor 715 can be configured to increase the area of the first portion by extending the first edge of the first OD region (block 350).

In some embodiments, if the first portion of the first OD region is not to be electrically coupled with a signal net, the processor 715 can be configured to increase the area of the first portion by replacing the first dummy gate electrode with a first dummy transistor (block 260) as described above in conjunction with FIGS. 3A and 3B.

In some embodiments, if the space is larger than the pitch of the first gate electrode, and the processor 715 can be further configured to determine if the space is larger than or equal to two times of the pitch (block 365) as described above in conjunction with FIG. 4A. If the space is larger than or equal to two times of the pitch, the processor 715 can be further configured to replace a third dummy gate electrode with a second dummy transistor (block 370).

In a first exemplary embodiment of this application, a method of designing an integrated circuit includes providing a cell library including a first and second cell structures. The cell structures each include a dummy gate electrode disposed on a boundary. An edge gate electrode is disposed adjacent to the dummy gate electrode. An oxide definition (OD) region has an edge disposed between the edge gate electrode and the dummy gate electrode. The method includes determining if the cell structures are to be abutted with each other. If so, the method includes abutting the cell structures. If not so, the method includes increasing areas of portions of the OD regions between the edge gate electrodes and the dummy gate electrodes.

In a second exemplary embodiment of this application, a method of designing an integrated circuit includes providing a cell library including a first cell structure and a second cell structure. The first cell structure includes a first dummy gate electrode spaced from a first boundary of the first cell structure, a first edge gate electrode disposed adjacent to the first dummy gate electrode, and a first oxide definition (OD) region having a first portion continuously extending between the first edge gate electrode and the first dummy gate electrode. The second cell structure includes a second dummy gate electrode spaced from a second boundary of the second cell structure, a second edge gate electrode disposed adjacent to the second dummy gate electrode, and a second oxide definition (OD) region having a second portion continuously extending between the second edge gate electrode and the second dummy gate electrode. The method includes abutting the first boundary and the second boundary.

In a third exemplary embodiment of this application, a computer system includes a computer readable storage medium electrically coupled with a processor. The computer readable storage medium is configured to store a cell library including a first cell structure and a second cell structure. The first cell structure includes a first dummy gate electrode disposed on a first boundary of the first cell structure, a first edge gate electrode disposed adjacent to the first dummy gate electrode, and a first oxide definition (OD) region having a first edge disposed between the first edge gate electrode and the first dummy gate electrode. The second cell structure includes a second dummy gate electrode disposed on a second boundary of the second cell structure, a second edge gate electrode disposed adjacent to the second dummy gate electrode, and a second OD region having a second edge disposed between the second edge gate electrode and the second dummy gate electrode. The processor is configured to determine if the first cell structure is to be abutted with the second cell structure. If the first cell structure is to be abutted with the second cell structure, the processor is configured to abut the first cell structure with the second cell structure. If the first cell structure is not to be abutted with the second cell structure, the processor is configured to increase an area of a first portion of the first OD region between the first edge gate electrode and the first dummy gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of designing an integrated circuit, the method comprising:
    providing a cell library including a first cell structure and a second cell structure, the first cell structure including a first dummy gate electrode disposed on a first boundary of the first cell structure, a first edge gate electrode disposed adjacent to the first dummy gate electrode, a first oxide definition (OD) region having a first edge disposed between the first edge gate electrode and the first dummy gate electrode, the second cell structure including a second dummy gate electrode disposed on a second boundary of the second cell structure, a second edge gate electrode disposed adjacent to the second dummy gate electrode, a second OD region having a second edge disposed between the second edge gate electrode and the second dummy gate electrode; and
    determining, using a computer, if the first cell structure is to be abutted with the second cell structure, wherein if the first cell structure is to be abutted with the second cell structure, the method includes abutting the first cell structure with the second cell structure, and if the first cell structure is not to be abutted with the second cell structure, the method includes increasing an area of a first portion of the first OD region between the first edge gate electrode and the first dummy gate electrode;
    wherein said increasing the area of a first portion of the first OD region comprises:
    determining if a space between the first and second boundaries is larger than a pitch of the first gate electrode, wherein if the space is not larger than the pitch of the first gate electrode, the method includes increasing the area of the first portion by extending the first edge of the first OD region, and if the space is larger than the pitch of the first gate electrode, the method further includes:
        determining if the first portion of the first OD region is to be electrically coupled with a signal net, wherein if the first portion of the first OD region is to be electrically coupled with a signal net, the method includes increasing the area of the first portion by extending the first edge of the first OD region, and if the first portion of the first OD region is not to be electrically coupled with a signal net, the method includes increasing the area of the first portion by replacing the first dummy gate electrode with a first dummy transistor.

2. The method of claim 1, wherein if the first cell structure is not to be abutted with the second cell structure, the method further includes increasing an area of a second portion of the second OD region between the second edge gate electrode and the second dummy gate electrode.

3. The method of claim 1, wherein said increasing the area of the first portion of the first OD region includes extending the first edge of the first OD region to be substantially aligned with an edge of the first dummy gate electrode.

4. The method of claim 1, wherein said increasing the area of the first portion of the first OD region includes overlapping the first portion of the first OD region with the first dummy gate electrode.

5. The method of claim 1, wherein the area of the first portion of the first OD region is increased by extending the first edge of the first OD region cross the first dummy gate electrode.

6. The method of claim 5, wherein the extended first edge of the first OD region is electrically isolated from the second edge of the second OD region.

7. The method of claim 1, wherein if the space is larger than the pitch of the first gate electrode, the method further includes:
    determining if the space is larger than or equal to two times of the pitch, wherein if the space is larger than or equal to two times of the pitch, the method further includes placing a third dummy gate electrode between the first and second dummy gate electrodes.

8. The method of claim 7, wherein if the space is not larger than or equal to two times of the pitch, the method further includes placing a second dummy transistor between the first and second dummy gate electrodes.

9. The method of claim 8, wherein said determining if the space is larger than or equal to two times of the pitch is performed before said determining if the first portion of the first OD region is to be electrically coupled with the signal net.

10. A method of designing an integrated circuit, the method comprising:

providing a cell library including a first cell structure and a second cell structure, the first cell structure including a first dummy gate electrode spaced from an adjacent first boundary of the first cell structure, a first edge gate electrode disposed adjacent to the first dummy gate electrode, a first oxide definition (OD) region having a first portion continuously extending between the first edge gate electrode and the first dummy gate electrode, the second cell structure including a second dummy gate electrode spaced from an adjacent second boundary of the second cell structure, a second edge gate electrode disposed adjacent to the second dummy gate electrode, a second OD region having a second portion continuously extending between the second edge gate electrode and the second dummy gate electrode; and abutting, using a computer, the first boundary and the second boundary.

11. The method of claim 10, wherein an edge of the first portion of the first OD region is substantially aligned with an edge of the first dummy gate electrode.

12. The method of claim 10, wherein an edge of the first portion of the first OD region overlaps with the first dummy gate electrode.

13. The method of claim 10, wherein the first portion of the first OD region extends across an entire width of the first dummy gate electrode.

14. The method of claim 10, wherein
the first dummy gate electrode is positioned between the first boundary of the first cell and the first edge gate electrode,
the second dummy gate electrode is positioned between the second boundary of the second cell structure and the second edge gate electrode, and
the first dummy gate electrode and the second dummy gate electrode are spaced from each other and positioned on opposite sides of the abutted first and second boundaries.

15. A computer system comprising:
a computer readable storage medium configured to store a cell library including a first cell structure and a second cell structure, wherein the first cell structure includes a first dummy gate electrode disposed on a first boundary of the first cell structure, a first edge gate electrode disposed adjacent to the first dummy gate electrode, and a first oxide definition (OD) region having a first edge disposed between the first edge gate electrode and the first dummy gate electrode, and the second cell structure includes a second dummy gate electrode disposed on a second boundary of the second cell structure, a second edge gate electrode disposed adjacent to the second dummy gate electrode, and a second OD region having a second edge disposed between the second edge gate electrode and the second dummy gate electrode; and
a processor electrically coupled with the computer readable storage medium, the processor being configured to determine if the first cell structure is to be abutted with the second cell structure, wherein if the first cell structure is to be abutted with the second cell structure, the processor is configured to abut the first cell structure with the second cell structure, and if the first cell structure is not to be abutted with the second cell structure, the processor is configured to increase an area of a first portion of the first OD region between the first edge gate electrode and the first dummy gate electrode by extending the first edge of the first OD region to be substantially aligned with an edge of the first dummy gate electrode or to overlap the first dummy gate electrode such that, in either case, the distance from the first edge gate electrode to the farthest edge of the dummy gate electrode is greater than the distance from the first edge gate electrode to the first edge of the first OD region.

16. The computer system of claim 15, wherein if the first cell structure is not to be abutted with the second cell structure, the processor is further configured to increase an area of a second portion of the second OD region between the second edge gate electrode and the second dummy gate electrode.

17. The computer system of claim 16, wherein the processor is configured to increase the area of the second portion of the second OD region by extending the second edge of the second OD region to be substantially aligned with an edge of the second dummy gate electrode.

18. The computer system of claim 16, wherein the processor is configured to increase the area of the second portion of the second OD region by extending the second edge of the second OD region to overlap the second dummy gate electrode.

19. The computer system of claim 15, wherein if the first cell structure is not to be abutted with the second cell structure, the processor is further configured to:
determine if a space between the first and second boundaries is larger than a pitch of the first gate electrode, wherein if the space is not larger than the pitch of the first gate electrode, the processor is configured to increase the area of the first portion by extending the first edge of the first OD region, and if the space is larger than the pitch of the first gate electrode, the processor is further configured to:
determine if the first portion of the first OD region is to be electrically coupled with a signal net, wherein if the first portion of the first OD region is to be electrically coupled with a signal net, the processor is configured to increase the area of the first portion by extending the first edge of the first OD region, and if the first portion of the first OD region is not to be electrically coupled with a signal net, the processor is configured to increase the area of the first portion by replacing the first dummy gate electrode with a first dummy transistor.

20. The computer system of claim 19, wherein if the space is larger than the pitch of the first gate electrode, and the processor is further configured to:
determine if the space is larger than or equal to two times of the pitch, wherein if the space is larger than or equal to two times of the pitch, the processor is further configured to place third dummy gate electrode between the first and second dummy gate electrodes.

21. The computer system of claim 20, wherein if the space is not larger than or equal to two times of the pitch, the method further includes placing a second dummy transistor between the first and second dummy gate electrodes.

* * * * *